United States Patent [19]

Mogami et al.

[11] Patent Number: 5,571,735
[45] Date of Patent: Nov. 5, 1996

[54] METHOD OF MANUFACTURING A SEMICONDUCTER DEVICE CAPABLE OF EASILY FORMING METAL SILICIDE FILMS ON SOURCE AND DRAIN REGIONS

[75] Inventors: Tohru Mogami; Toru Tatsumi, both of Tokyo, Japan

[73] Assignee: NEC Corporation, Japan

[21] Appl. No.: 490,653

[22] Filed: Jun. 16, 1995

[30] Foreign Application Priority Data

Jun. 21, 1994 [JP] Japan .................................. 6-138827
Apr. 6, 1995 [JP] Japan .................................. 7-081185

[51] Int. Cl.⁶ .................................................. H01L 21/265
[52] U.S. Cl. ........................... 437/41; 437/46; 437/193; 437/200
[58] Field of Search ................................ 437/41 RCM, 437/41 SM, 24, 46, 193, 200, 201, 41

[56] References Cited

U.S. PATENT DOCUMENTS

| | | | |
|---|---|---|---|
| 5,156,994 | 10/1992 | Moslehi | 437/89 |
| 5,236,872 | 8/1993 | Van Ommen et al. | 437/200 |
| 5,420,074 | 5/1995 | Ohshimo | 437/193 |
| 5,432,129 | 7/1995 | Hodges | 437/193 |

FOREIGN PATENT DOCUMENTS

| | | |
|---|---|---|
| 8607491 | 12/1986 | European Pat. Off. . |
| 60-14461 | 1/1985 | Japan . |
| 60-128656 | 7/1985 | Japan . |
| 61-3461 | 1/1986 | Japan . |

OTHER PUBLICATIONS

Takahashi, M., et al., "Anomalous Resistance in 0.1 μm-Region Ti-Silicided Poly Si Gate", Extended Abstracts of the 1993 Conference on Solid State Devices and Materials, Makuhari, 1993, pp. 458–460.

Beyers, et al., "Titanium Disilicide Formation on Heavily Doped Silicon Substrates", J. Appl. Phys., vol. 61, No. 11, Jun. 1, 1987, pp. 5110–5117.

Primary Examiner—George Fourson
Assistant Examiner—Thomas G. Bilodeau

[57] ABSTRACT

In a method of manufacturing a semiconductor device, a step (d) of forming metal silicide films (20) on source and drain regions (17, 18) and on gate electrodes (71, 81) comprises selectively depositing silicon thin films (19) on the source and drain regions and the gate electrodes, the silicon thin films having impurity concentration less than $10^{19}$ cm$^{-3}$; amorphizing the silicon thin films, the gate electrodes, and a silicon semiconductor substrate (11) by ion implantation; depositing a metal film on the silicon thin films, on the gate electrodes, and on the silicon semiconductor substrate; performing heat treatment of the metal film to form the metal silicide films (20) on the source and drain regions and the gate electrodes; and removing unreacted metal films (21) remaining on insulating films (16-1, 16-2). Preferably, the selectively depositing step may be performed by a chemical vapor deposition process of a reaction rate-determining mode by using disilane gas or silane gas.

9 Claims, 7 Drawing Sheets

METHOD OF MANUFACTURING A SEMICONDUCTER DEVICE CAPABLE OF EASILY FORMING METAL SILICIDE FILMS ON SOURCE AND DRAIN REGIONS

BACKGROUND OF THE INVENTION

This invention relates to a method of manufacturing a semiconductor device and, in particular, to a method of manufacturing a complementary metal oxide semiconductor field effect transistor (CMOSFET) having a metal silicide film formed on at least source and drain regions.

In metal oxide semiconductor field effect transistors (MOSFETs) composing an integrated circuit (IC), miniaturization of gate electrodes has been progressing. In the MOSFETs having minute gate electrodes, parasitic resistance of the gate electrodes and the source and drain regions are relatively higher than channel resistance of the MOSFETs. As a result, such MOSFETs are disadvantageous in that a drain current decreases.

In order to prevent the above-mentioned degradation of a device characteristic, two types of MOSFETs have been already proposed. One type is an MOSFET of salicide (self-aligned silicide) structure while another type is an MOSFET of polycide structure. The MOSFET of salicide structure is an MOSFET wherein metal silicide films are simultaneously formed on the gate electrode and the source and drain regions. The MOSFET of polycide structure is an MOSFET wherein the gate electrode comprises structure of two layers which is a combination of a metal silicide film and a polysilicon film.

However, as reported by Minoru Takahashi et al. in a paper contributed to "Extended Abstracts of the 1993 International Conference on Solid State Devices and Materials", Makuhari, 1993, pages 458–460, under the title of "Anomalous Resistance in 0.1 μm-Region Ti-Silicided Poly Si Gate", the MOSFET of salicide structure is disadvantageous in that the metal silicide film on the gate electrode has high electric resistance when the gate electrode is miniaturized as will later be described in conjunction with FIGS. i(A) through i(D).

In addition, as reported by Robert Beyers et al. in a paper contributed to "JOURNAL OF APPLIED PHYSICS", Vol. 61, No. 11 (1 Jun. 1987), pages 5110–5117, under the title of "Titanium disilicide formation on heavily doped silicon substrates", silicide forming reaction depends on types of and concentration of impurities in a silicon substrate. As a result, in the manner which will later be described in conjunction with FIGS. 1(A) through 1(D) and FIGS. 2(A) through 2(D), conventional manufacturing processes for CMOSFETs are disadvantageous in that it is impossible to obtain metal silicide films on a P-channel MOSFET region and metal silicide films on an N-channel MOSFET region which have thicknesses equal to each other. This is because the silicide forming reaction is carried out after impurities are doped in the silicon substrate and the metal silicide films are simultaneously formed on the P-channel MOSFET region and the N-channel MOSFET region.

In addition, it is difficult to form metal silicide films having thick thicknesses on the source and drain regions. This is because the source and drain regions have a shallow junction depth due to better performance of a device with miniaturization of the device.

To solve this problem, "laying-on structure" are already proposed, for example, Japanese Unexamined Patent Prepublication No. 14461/1985, Japanese Unexamined Patent Prepublication No. 128656/1985, and Japanese Unexamined Patent Prepublication No. 3461/1986. However, the laying-on structure causes trouble as follows. Parasitic capacitance increases because the gate electrode and the drain region are adjacent to each other. It is difficult to form a junction depth of the source and drain regions with good control. It is difficult to form a metal silicide film because the metal silicide film is formed after diffusion of impurity in the source and drain regions.

SUMMARY OF THE INVENTION

It is therefore an object of this invention to provide a method of manufacturing a semiconductor device which is capable of obtaining metal silicide films having the same thickness on both of a P-channel MOSFET region and an N-channel MOSFET region.

It is another object of this invention to provide a method of manufacturing a semiconductor device of the type described, which is capable of decreasing parasitic capacitance.

It is still another object of this invention to provide a method of manufacturing a semiconductor device of the type described, which is capable of forming a junction depth of source and drain regions with good control.

It is yet another object of this invention to provide a method of manufacturing a semiconductor device of the type described, which is capable of easily forming metal silicide films.

Other objects of this invention will become clear as the description proceeds.

According to a first aspect of this invention, a method of manufacturing a semiconductor device comprising the steps of: forming silicon gate electrodes via gate insulating films on a silicon semiconductor substrate on which an element separation region is formed, the silicon gate electrodes having an upper surface and a side surface; forming insulating films on the side surface of the silicon gate electrodes; performing ion implantation of impurities in the element separation region to form source and drain regions of N-channel type and P-channel type field effect transistors on the silicon semiconductor substrate; selectively depositing silicon thin films on the source and drain regions and on the upper surface of the silicon gate electrodes, the silicon thin films having impurity concentration less than $10^{19}$ $cm^{-3}$; amorphizing the silicon thin films, the silicon gate electrodes, and the silicon semiconductor substrate by ion implantation; depositing a metal film on the silicon thin films and on the silicon gate electrodes; performing heat treatment of the metal film to form metal silicide films on the source and drain regions and on the upper surface of the silicon gate electrodes; and removing unreacted metal films remaining on the insulating films.

According to a second aspect of this invention, a method of manufacturing a semiconductor device comprising the steps of: forming gate electrodes via gate insulating films on a silicon semiconductor substrate on which an element separation region is formed, each of the gate electrodes consisting of a polysilicon film and a first metal silicide film, each of the gate electrodes having a side surface; forming insulating films on the side surface of the gate electrodes; performing ion implantation of impurities in the element separation region to form source and drain regions of N-channel type and P-channel type field effect transistors on the silicon semiconductor substrate; selectively depositing silicon thin films on the source and drain regions, the silicon thin films having impurity concentration less than $10^{19}$ cm$^{-3}$; amorphizing the silicon thin films, the gate electrodes, and the silicon semiconductor substrate by ion implantation; depositing a metal film on the silicon thin films and on the gate electrodes; performing heat treatment of the metal film to form second metal silicide films on the source and drain regions; and removing unreacted metal films remaining on the insulating films and on the gate electrodes.

According to a third aspect of this invention, a method of manufacturing a semiconductor device comprising the steps of: forming gate electrodes via gate insulating films on a silicon semiconductor substrate on which an element separation region is formed, each of the gate electrodes consisting of a polysilicon film and a first metal silicide film, each of the silicon gates having an upper surface and a side surface; forming insulating films on both of the upper surface and the side surface of the gate electrodes; performing ion implantation of impurities in the element separation region to form source and drain regions of N-channel type and P-channel type field effect transistors on the silicon semiconductor substrate; selectively depositing silicon thin films on the source and drain regions, the silicon thin films having impurity concentration less than $10^{19}$ cm$^{-3}$; amorphizing the silicon thin films, the gate electrodes, and the silicon semiconductor substrate by ion implantation; depositing a metal film on the silicon thin films and on the gate electrodes; performing heat treatment of the metal film to form second metal silicide films on the source and drain regions; and removing unreacted metal films remaining on the insulating films.

DESCRIPTION OF THE PREFERRED EMBODIMENTS

Referring to FIGS. 1(A) through 1(D), a manufacturing method of a conventional semiconductor device will first be described in order to facilitate an understanding of the present invention. The illustrated semiconductor device is a complementary metal oxide semiconductor (CMOS) device of self-aligned silicide (salicide) structure.

Figure 1A:
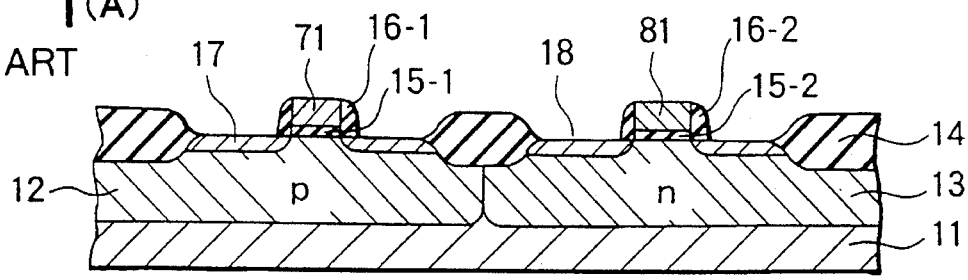
FIGS. 1(A)–1(D) illustrate the manufacturing process sequence of a conventional semiconductor device.

As shown in FIG. 1(A), a silicon semiconductor substrate 11 is prepared in a known manner. A P-well layer 12 and an N-well layer 13 are formed in the silicon semiconductor substrate 11. An element isolation region 14 is formed on the P-well layer 12 and the N-well layer 13 to define first and second element forming areas on the P-well layer 12 and the N-well layer 13, respectively. The first element forming area is for an N-channel metal oxide semiconductor field effect transistor (NMOSFET) region while the second element forming area is for a P-channel metal oxide semiconductor field effect transistor (PMOSFET) region.

First and second gate insulating layers 15-1 and 15-2 are formed on the first and the second element forming areas by thermal oxidation process. First and second polysilicon layers are deposited on the first and the second gate insulating layers 15-1 and 15-2, respectively. By anisotropic etching the first and the second polysilicon layers, first and second silicon gate electrodes 71 and 81 are formed on the first and the second gate insulating layers 15-1 and 15-2, respectively. Each of the first and the second silicon gate electrodes 71 and 81 has an upper surface and a side surface. A silicon oxide film is deposited on an entire surface of the silicon semiconductor substrate 11 by a chemical vapor deposition (CVD) process. By anisotropic etching the silicon oxide film, first and second oxide film spacers 16-1 and 16-2 are formed on the side surfaces of the first and the second silicon gate electrodes 71 and 81, respectively.

Subsequently, ion implantation of an N-type impurity is made in the P-well layer 12 to form source and drain regions 17 of the NMOSFET region on the P-well layer 12. Ion implantation of a P-type impurity is made in the N-well layer 13 to form source and drain regions 18 of the PMOSFET region on the N-well layer 13.

Figure 1B:
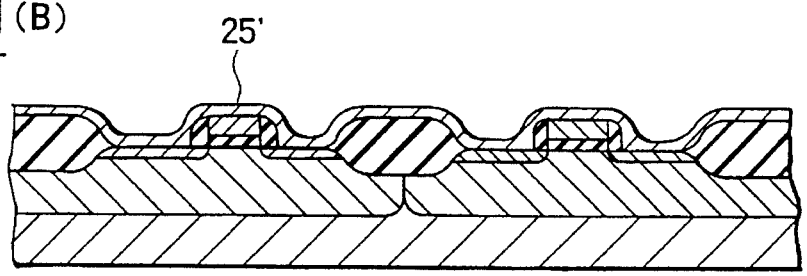

Turning to FIG. 1(B), in order to reduce resistance of the silicon gate electrodes 71 and 81 and the source and drain regions 17 and 18, a metal film 25' is deposited on the entire surface of the silicon semiconductor substrate 11.

Figure 1C:
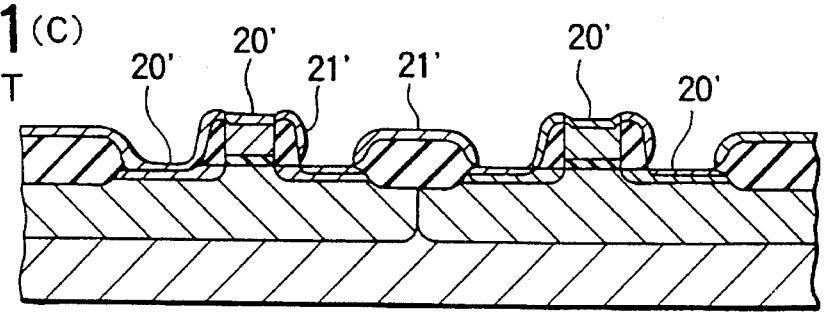

Turning to FIG. 1(C), by heat treatment of the metal film 25', metal silicide films 20' are formed on the first and the second silicon gate electrodes 15-1 and 15-2 and the source and drain regions 17 and 18 in a self-alignment fashion.

Figure 1D:
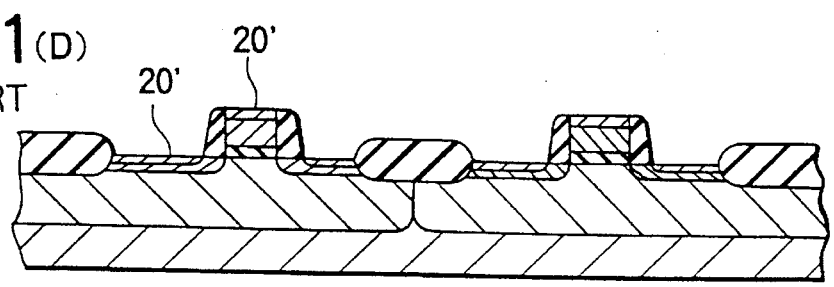

Turning to FIG. 1(D), unreacted metal films 21' on the insulating films 16-1 and 16-2 are selectively removed by wet etching process using an aqueous solution of hydrogen peroxide system. As a result, the metal silicide films 20' on the CMOS device are completed.

However, as reported by Minoru Takahashi et al. in a paper contributed to "Extended Abstracts of the 1993 International Conference on Solid State Devices and Materials", Makuhari, 1993, pages 458–460, under the title of "Anomalous Resistance in 0.1 μm-Region Ti-Silicided Poly Si Gate", the conventional CMOS device of salicide structure is disadvantageous in that the metal silicide films 20' on the silicon gate electrodes 71 and 81 have higher electric resistance when the silicon gate electrodes 71 and 81 are miniaturized.

Referring to FIGS. 2(A) through 2(D), a manufacturing method of another conventional semiconductor device will be described in order to facilitate an understanding of the present invention. The illustrated semiconductor device is a complementary metal oxide semiconductor (CMOS) device of polycide structure.

Figure 2A:
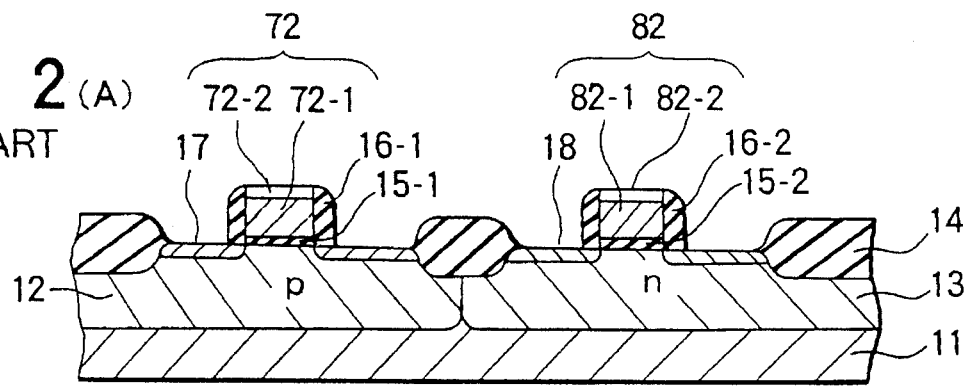
FIGS. 2(A)–2(D) illustrate the manufacturing process sequence of another conventional semiconductor device.

As shown in FIG. 2(A), a silicon semiconductor substrate 11 is prepared in a known manner. A P-well layer 12 and an N-well layer 13 are formed in the silicon semiconductor substrate 11. An element isolation region 14 is formed on the P-well layer 12 and the N-well layer 13 to define first and second element forming areas on the P-well layer 12 and the N-well layer 13, respectively. The first element forming area is for an N-channel metal oxide semiconductor field effect transistor (NMOSFET) region while the second element forming area is for a P-channel metal oxide semiconductor field effect transistor (PMOSFET) region.

First and second gate insulating layers 15-1 and 15-2 are formed on the first and the second element forming areas by thermal oxidation process. First and second polysilicon layers are deposited on the first and the second gate insulating layers 15-1 and 15-2, respectively. Phosphorus (P) is diffused in the first and second polysilicon layers to form first and second phosphorus-doped polysilicon layers 72-1 and 82-1, respectively. First and second tungsten silicide films 72-2 and 82-2 are deposited by sputtering process on the first and the second phosphorus-doped polysilicon layers 72-1 and 82-1, respectively. By anisotropic etching of the first and the second phosphorus-doped polysilicon layers 72-1 and 82-1 and of the first and the second tungsten silicide films 72-2 and 82-2, first and second gate electrodes 72 and 82 are formed on the first and the second gate insulating layers 15-1 and 15-2, respectively. A silicon oxide film is deposited on an entire surface of the silicon semiconductor substrate 11 by a chemical vapor deposition (CVD) process. By anisotropic etching of the silicon oxide film, first and second oxide film spacers 16-1 and 16-2 are formed on side surfaces of the first and the second gate electrodes 72 and 82, respectively.

Subsequently, ion implantation of an N-type impurity is made in the P-well layer 12 to form source and drain regions 17 of the NMOSFET region on the P-well layer 12. Ion implantation of a P-type impurity is made in the N-well layer 13 to form source and drain regions 18 of the PMOSFET region on the N-well layer 13.

Figure 2B:
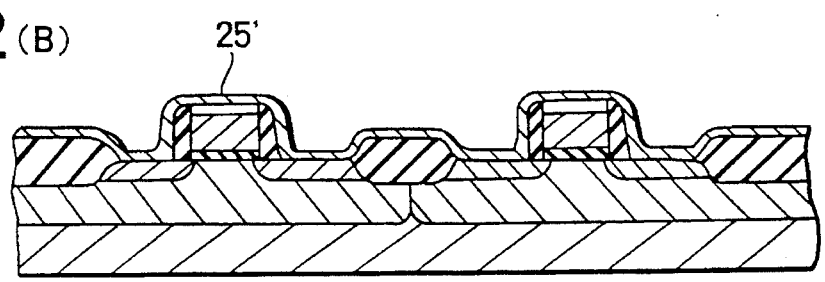

Turning to FIG. 2(B), in order to reduce resistance of the source and drain regions 17 and 18, a metal film 25' is deposited on the entire surface of the silicon semiconductor substrate 11.

Figure 2C:
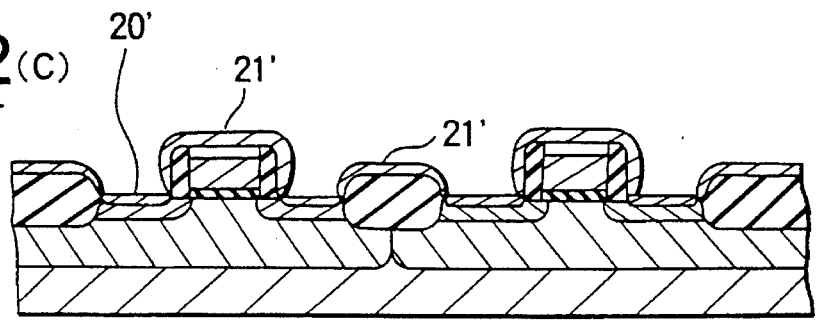

Turning to FIG. 2(C), by heat treatment of the metal film 15', metal silicide films 20' are formed on the source and drain regions 17 and 18 in a self-alignment fashion.

Figure 2D:
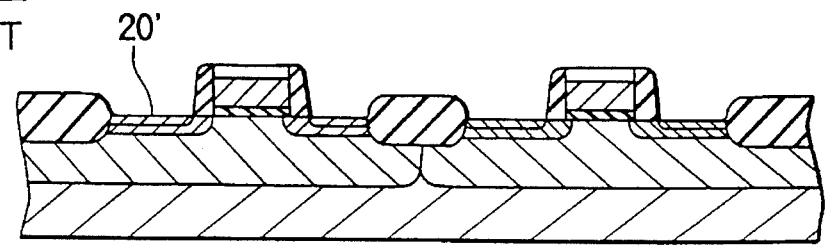

Turning to FIG. 2(D), unreacted metal films 21' on the insulating films 16-1 and 16-2 and on upper surfaces of the gate electrodes 72 and 82 are selectively removed by wet etching process using an aqueous solution of hydrogen peroxide system. As a result, silicide films on the CMOS are completed.

As reported by Robert Beyers et al. in a paper contributed to "JOURNAL OF APPLIED PHYSICS", Vol. 61, No. 11 (1 Jun. 1987), pages 5110–5117, under the title of "Titanium disilicide formation on heavily doped silicon substrates", reaction of silicide depends on types of and concentration of impurities in a silicon substrate. As a result, the manufacturing processes for the CMOS transistors illustrated in FIGS. 1 and 2 are disadvantageous in that it is impossible to obtain metal silicide films having thickness equal to each other. This is because the reaction of silicide is carried out after impurities are doped in the silicon substrate and the metal silicides are simultaneously formed in the PMOSFET region and the NMOSFET region.

In addition, it is difficult to form metal silicide films having thick thickness on source and drain regions. This is because the source and the drain regions have a shallow junction depth due to better performance of a device with miniaturization of the device.

To solve this problem, "laying-on structures" are already proposed. For example, Japanese Unexamined Patent Prepublication No. 14461/1985 discloses "COMPLEMENTARY INSULATED GATE FIELD-EFFECT TRANSISTOR", which operates the titled transistor at the normal supply voltage even at a short channel length as well as prevents generation of a latchup phenomenon by a method wherein an N type drain region and a P type drain region, having the maximum impurity density of impurity diffusion region within the specified range respectively, are provided and a part of each drain region is connected to a high melting metal or its silicide layer. For that purpose, the titled transistor has an N type drain region having the maximum impurity density of an impurity diffusion region $10^{18}$–$10^{20}$ $cm^{-3}$ or thereabout and a P type drain region having the maximum impurity density of $10^{17}$–$10^{19}$ $cm^{-3}$ or thereabout, and it is constituted in such a manner that at least a part of said drain regions is connected to a high melting point metal or its metal silicide layer. After ions have been implanted, an activation and a heat treatment are performed on the implanted ions, and an N conductive type source and drain are formed. The quantity of arsenic ion is set in such a manner that the impurity density on the surface of said source and drain will be finally formed at $3\times10^{18} cm^{-3}$ when channel length is 0.5 μm or above and at $1\times10^{18}$ $cm^{-3}$ when channel length is 0.3 μm or below. Also, the condition of heat treatment is controlled in such a manner that the junction depth of the source and the drain diffusion layer will be finally formed at 0.25 μm.

Japanese Unexamined Patent Prepublication No. 128656/1985 discloses "SEMICONDUCTOR DEVICE", which attains high speeds and high integration by a method wherein polycrystalline Si is formed by self-alignment on the low-density source and drain of an MOS transistor and a lower-resistance metal or silicide layer is formed by self-alignment on said polycrystalline Si. For that purpose, an oxide film is formed on a P type Si substrate and the oxide film is trimmed for the formation of an activation region and a field oxide film. Then a gate insulating film is formed in the activation region. P type impurity ions such as B is injected under high energy into the Si substrate for the formation of a P type region. A gate electrode is composed of such a metal as W or a silicide or polycrystalline Si, whereafter ions of an N type impurity such as P or As are injected for the formation of low-density source, drain regions. Next, an insulating film is formed, which is then subjected to etching, with a space retained at the step. Densely doped N type polycrystalline Si layers, layers of such a metal as W or a silicide are formed selectively.

Japanese Unexamined Patent Prepublication No. 3461/1986 discloses "MANUFACTURE OF SEMICONDUCTOR DEVICE", which enables the formation of silicide layer also on a diffused layer having a shallow junction by a method wherein a silicide layer is formed in a single crystal or polycrystalline Si layer grown on a diffused layer after the polycrystalline Si on a gate electrode and a wiring and the Si substrate on the diffused layer are exposed with a thermal oxide film left on the side surface. For that purpose, in division into a transistor region and a field region, a gate oxide film is formed in transistor region, and polycrystalline Si's to serve as the gate electrode and the wiring are left by patterning polycrystalline Si. Thereafter, source-drain diffused layers are formed in self-alignment by ion implantation of an impurity of reverse conductivity to that of the semiconductor substrate, and a thermal oxide film is formed on the surface of the semiconductor substrate and the surfaces of the gate electrode and the wiring. Next, the oxide film is left only on the side surfaces of the gate electrode and the wiring by etching the oxide film, resulting in the exposure of the Si on the diffused layer, gate electrode, and wiring. Then, single crystal Si is grown on the diffused layers, and polycrystalline Si on the gate electrode and the wiring, thereafter, the whole surface of the substrate is coated with a high melting point metal.

Each of the above-mentioned Japanese Unexamined Patent Prepublications disclose "laying-on structure" wherein silicon layers are laid on source and drain regions. According to the laying-on structure, although an actual junction depth is deep, an effective junction depth affecting short channel effect is shallow.

However, the laying-on structure causes troubles as follows. Parasitic capacitance increases because the gate electrode and the drain region are adjacent to each other. It is difficult to form a junction depth of source and drain regions with good control. It is difficult to form a metal silicide film because the metal silicide film is formed after diffusion of impurity in the source and drain regions.

PRINCIPLE

The present invention is made on the basis of experimental results as regards silicide forming reaction in a silicon. When impurity in the silicon is arsenic (As) having concentration which is not less than $5 \times 10^{19}$ $cm^{-3}$, it is difficult to form a metal silicide film because the silicide forming reaction between the silicon and a metal film is suppressed.

However, the silicide forming reaction is almost not suppressed when impurity in the silicon is arsenic (As) having concentration less than $1 \times 10^{19}$ $cm^{-3}$ when impurity in the silicon is boron (B), or when no impurity exists in the silicon.

Figure 3:
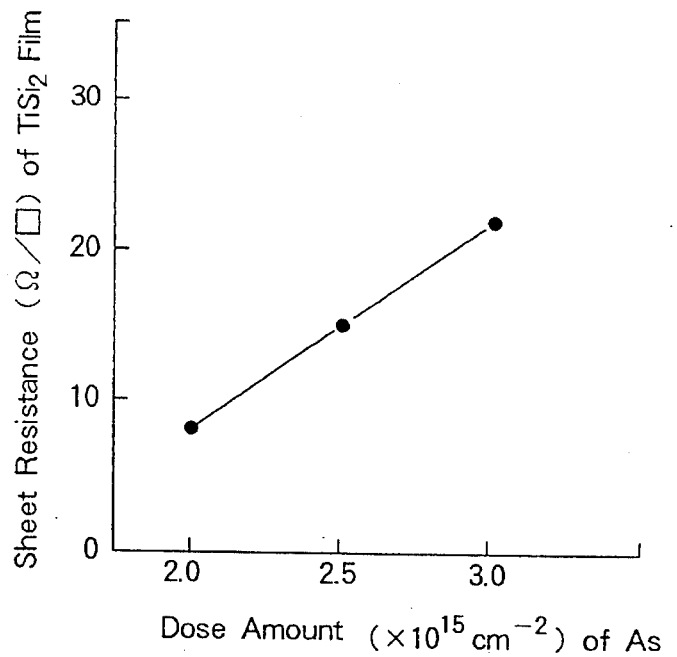
FIG. 3 shows a relationship between a sheet resistance of a metal silicide film formed under the condition of the same heat treatment and impurity in a silicon.

FIG. 3 shows a relationship between impurity in a silicon and a sheet resistance of a silicide film formed by the same heat treatment. The abscissa and the ordinate represent dose amount ($\times 10^{15}$ $cm^{-2}$) of arsenic (As) and the sheet resistance ($\Omega/\square$) of a titanium disilicide ($TiSi_2$) film as the metal silicide film. As apparent from FIG. 3, the optimum substrate structure for forming the metal silicide film on the silicon is the silicon containing no impurity.

However, it is impossible in a normal CMOS manufacturing process to make the silicide forming reaction between the metal film and the silicon containing no impurity. This is because forming of a metal silicide is performed after diffusion of impurity in source and drain regions.

This invention uses a silicon selection growth to enable the silicide forming reaction between the metal film and the silicon containing no impurity or little impurity after diffusion of impurity in a gate electrode and the source and drain regions.

More specifically, this invention uses the silicon selection growth at low temperature wherein impurity in a gate polysilicon and source and drain regions are not diffused in a selective growing silicon. As a result, it is possible to deposit a silicon film containing no or little impurity on the gate electrode and on the source and drain regions after diffusion of impurity in the gate electrode and the source and drain regions. Accordingly, it is possible to use the silicon containing no or little impurity as substrate structure for forming the metal silicide film.

A super high vacuum vapor deposition technique may be used as a method of forming an undoped silicon layer. By using this technique, it is possible to selectively grow a silicon at low temperature under the condition of atmosphere of super high vacuum where vapor pressure of oxygen and water is extremely low. In addition, it is necessary for this invention to grow undoped silicon layers having the same thickness on (100) monocrystalline silicon and on polycrystalline silicon. The undoped silicon layer on the polycrystalline silicon has a growth rate which is different from that of the undoped silicon layer on the monocrystalline silicon. This is because the polycrystalline silicon has various surface orientations. This invention uses a new growth mode so as to make substrate orientation dependency of film growth rate disappear using reaction rate-determining mode as a mode of the silicon selection growth. For example, it is possible to make the substrate surface orientation dependency of the silicon selection growth disappear by carrying out silicon growth at low temperature with large flow rate of disilane gas. In other words, the reaction rate-determining node is a mode whereby the silicon films grow on the source and drain regions and on the upper surface of the silicon gate electrodes alone and the silicon film on the source and drain regions have a growth rate which is equal to that of the silicon films on the upper surface of the silicon gate electrodes, as indicated in FIG. 4.

Figure 4:
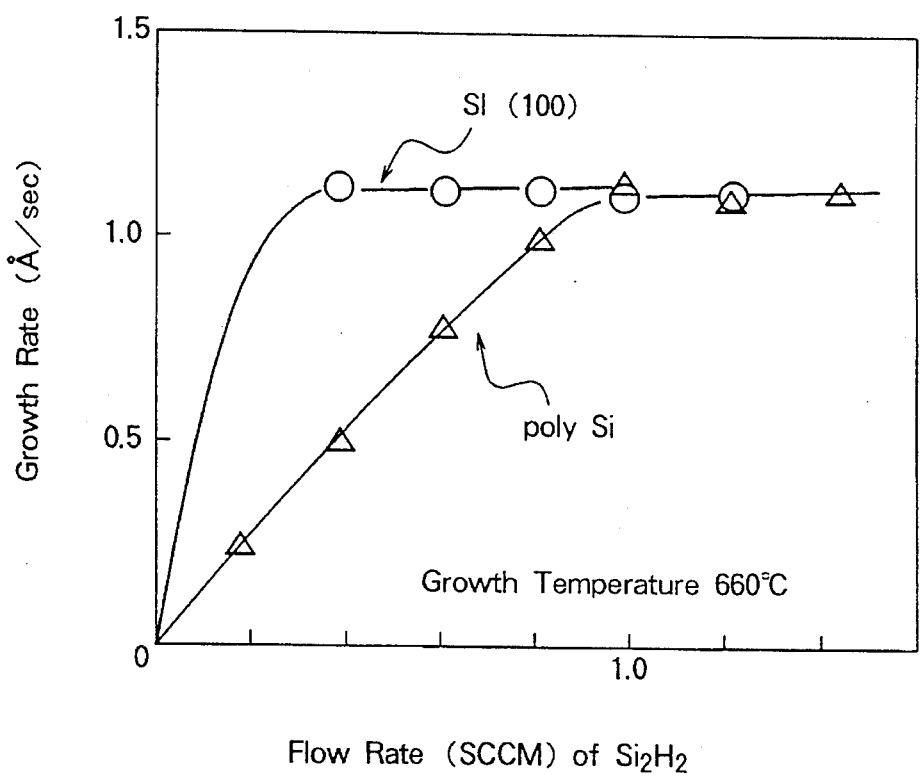
FIG. 4 shows characteristics of growth rate of monocrystalline silicon and polycrystalline silicon versus flow rate of disilane at a predetermined growth temperature.

FIG. 4 shows characteristic of growth rate of the monocrystalline silicon (Si(100)) and the polycrystalline silicon (polysilicon) at a predetermined growth temperature of 660° C. The abscissa and the ordinate represent the flow rate (SCCM) of the disilane ($Si_2H_6$) gas and the growth rate (Å/sec), respectively. In FIG. 4, white circles represent the growth rates of the undoped silicon layer on the monocrystalline silicon (Si(100)) while white triangles represent the growth rates of the undoped silicon layer on the polycrystalline silicon (polysilicon). When the flow rate of the disilane ($Si_2H_6$) gas is not less than 1.0 SCCM, the undoped silicon layers having the same thickness are formed on both source and drain regions and a gate polysilicon region.

In addition, in order to foster the silicide forming reaction in a minute region, this invention uses a method of amorphizing a selectively grown silicon and a silicon substrate by ion implantation.

Figure 5:
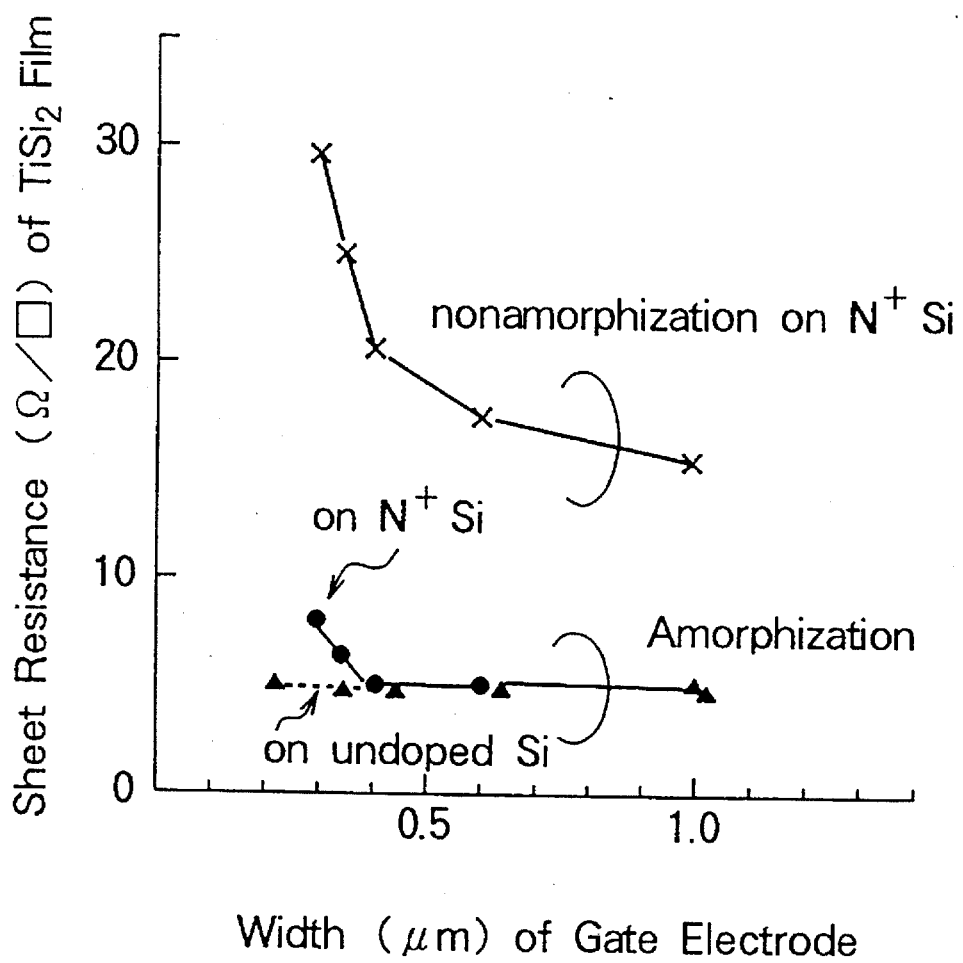
FIG. 5 shows line width dependency of a sheet resistance of an amorphous metal silicide film and a nonamorphous metal silicide film.

FIG. 5 shows line width dependency of sheet resistance of a metal silicide film fabricated using amorphization process and a metal silicide film fabricated not using amorphization process. The abscissa and the ordinate represent the width (μm) of a gate electrode and the sheet resistance ($\Omega/\square$) of a titanium disilicide ($TiSi_2$) film as the metal silicide film. The metal silicide film fabricated using amorphization process has the sheet resistance less than that of the metal silicide film fabricated not using amorphization process. It is obvious that making the silicon amorphous structure before silicidation is effective enhancement of the silicide forming reaction. In addition, it is obvious that the metal silicide film of low resistance is formed by using the undoped silicon as a substrate silicon although the substrate silicon has a width which is not more than 0.5 μm.

EXAMPLE 1

Referring to FIGS. 6(A) through 6(D), description will be made as regards a method of manufacturing a semiconductor device according to a first embodiment of the present invention. The illustrated semiconductor device is a complementary metal oxide semiconductor (CMOS) device of self-aligned silicide (salicide) structure.

Figure 6A:
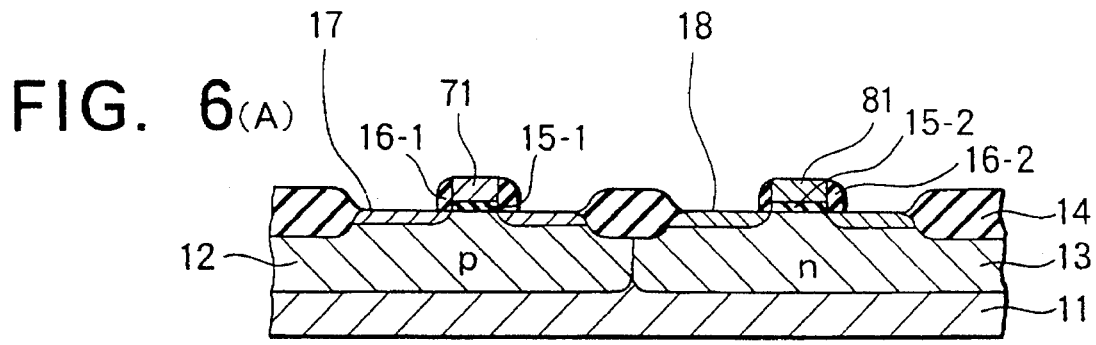
FIGS. 6(A)–6(D) illustrate the manufacturing process sequence of the semiconductor device according to a first embodiment of the present invention.

As shown in FIG. 6(A), a silicon semiconductor substrate 11 is prepared in a known manner. A P-well layer 12 and an N-well layer 13 are formed in the silicon semiconductor substrate 11. An element isolation region 14 is formed on the P-well layer 12 and the N-well layer 13 to define first and second element forming areas on the P-well layer 12 and the N-well layer 13, respectively. The first element forming area is for an N-channel metal oxide semiconductor field effect transistor (NMOSFET) region while the second element forming area is for a P-channel metal oxide semiconductor field effect transistor (PMOSFET) region.

First and second gate insulating layers 15-1 and 15-2 are formed by thermal oxidation process on the first and the second element forming areas, respectively. First and second undoped polysilicon layers are deposited on the first and the second gate insulating layers 15-1 and 15-2, respectively. By anisotropic etching of the first and the second undoped polysilicon layers, first and second silicon gate electrodes 71 and 81 are formed on the first and the second gate insulating layers 15-1 and 15-2, respectively. A silicon oxide film is deposited on an entire surface of the silicon semiconductor substrate 11 by a chemical vapor deposition (CVD) process. By anisotropic etching of the silicon oxide film, first and second oxide film spacers 16-1 and 16-2 are formed on side surfaces of the first and the second silicon gate electrodes 71 and 81, respectively.

Subsequently, ion implantation of arsenic (As) serving as an N-type impurity is made in the P-well layer 12 to form source and drain regions 17 of the NMOSFET region on the P-well layer 12. Ion implantation of boron difluoride (BF$_2$) serving as a P-type impurity is made in the N-well layer 13 to form source and drain regions 18 of the PMOSFET region on the N-well layer 13.

Figure 6B:
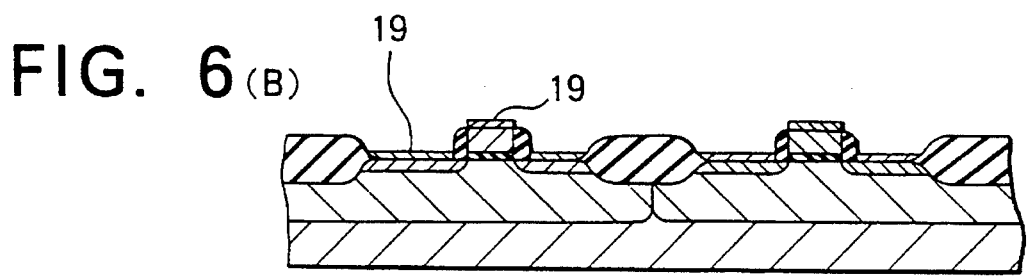

Turning to FIG. 6(B), the silicon semiconductor substrate 11 is put in a vacuum chamber (not shown). The vacuum chamber is evacuated at $1\times10^{-9}$ Torr. Disilane gas of 1 sccm is poured in the vacuum chamber. The silicon semiconductor substrate 11 is heated to about 660° C. Thereupon, silicon films 19 grow on upper surfaces of the first and the second silicon gate electrodes 71 and 81 and on the source and drain regions 17 and 18 alone. The silicon films 19 on the source and drain regions 17 and 18 have a growth rate of 1.2 Å/sec which is equal to that of the silicon films 19 on the upper surfaces of the first and the second silicon gate electrodes 71 and 81. The silicon films 19 have impurities of $5\times10^{18}$ cm$^{-3}$ and a thickness of 30 nm.

Subsequently, ion implantation of arsenic (As) is made in the selectively grown silicon film 19, the source and drain regions 17 and 18, and the first and the second silicon gate electrodes 71 and 81 under the condition of acceleration voltage of 30 keV and of dose amount of $3\times10^{14}$ cm$^{-2}$ to amorphize.

Figure 6C:
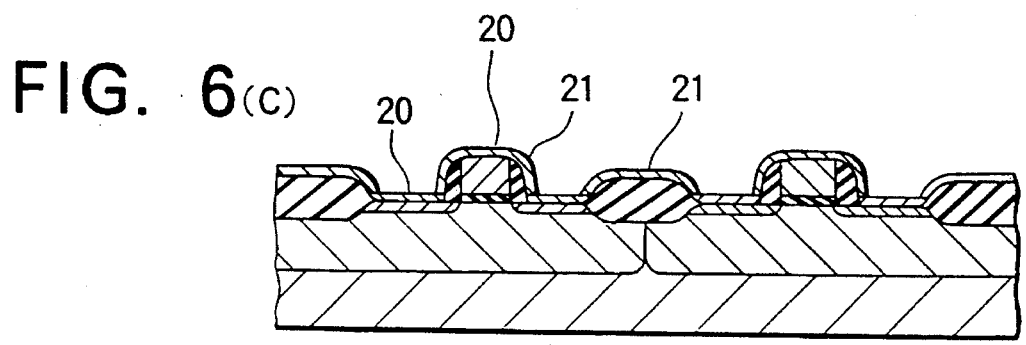

Turning to FIG. 6(C), by sputtering process, a titanium film of a thickness of 30 nm is deposited on the entire surface of the silicon semiconductor substrate 11. By lamp annealing process at 650° C. for 10 seconds, titanium disilicide films 20 are formed on the first and the second silicon gate electrodes 71 and 81 and the source and drain regions 17 and 18 in a self-alignment fashion.

As described above, after diffusion of impurities in the silicon gate electrodes 71 and 81 and the source and drain regions 17 and 18, the silicon films having little impurity are deposited on the silicon gate electrodes 71 and 81 and the source and the drain regions 17 and 18, and thereafter the silicon films 19, the silicon gate electrodes 17 and 18, and the source and drain regions 17 and 18 are amorphized by ion implantation of arsenic (As). As a result, reaction of silicide according to this embodiment is reaction of amorphous silicon films having little impurity and the titanium film. Accordingly, the titanium disilicide films 20 having low resistance can be formed on miniaturized gate electrodes 17 and 18 having a line width which is not more than 0.5 μm.

Figure 6D:
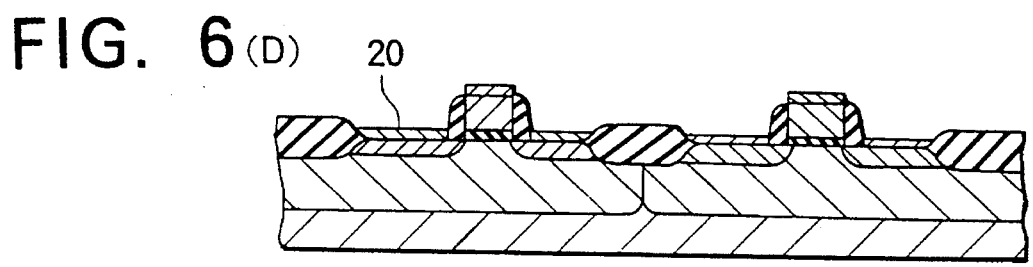

Turning to FIG. 6(D), unreacted metal films 21 on the insulating films 16-1 and 16-2 are selectively removed by wet etching process using an aqueous solution of hydrogen peroxide system. Subsequently, by lamp annealing process at 850° C. for 10 seconds, the titanium disilicide films 20 on the first and the second silicon gate electrodes 71 and 81 and on the source and drain regions 17 and 18 are made low resistance. As a result, the CMOS device is formed as shown in FIG. 6(D).

EXAMPLE 2

Referring to FIGS. 7(A) through 7(D), description will be made as regards a method of manufacturing a semiconductor device according to a second embodiment of the present invention. The illustrated semiconductor device is a complementary metal oxide semiconductor (CMOS) device of polycide structure.

Figure 7A:
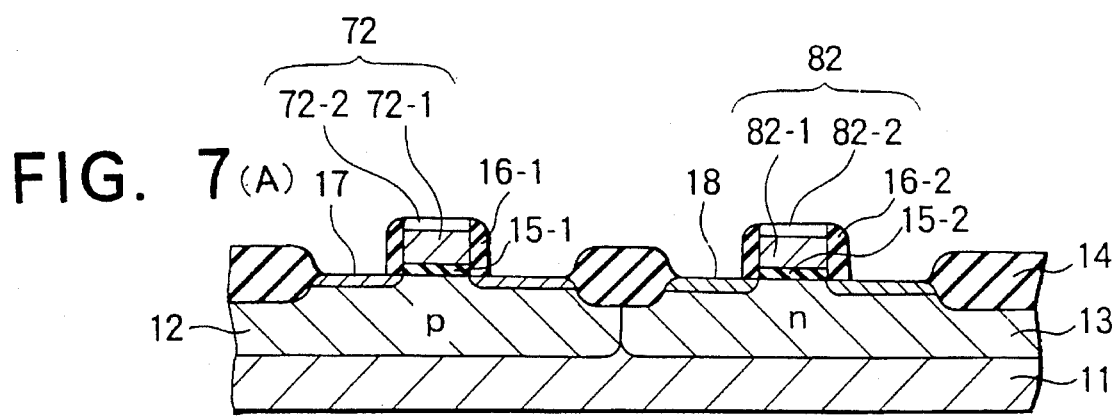
FIGS. 7(A)–7(D) illustrate the manufacturing process sequence of the semiconductor device according to a second embodiment of the present invention.

As shown in FIG. 7(A), a silicon semiconductor substrate 11 is prepared in a known manner. A P-well layer 12 and an N-well layer 13 are formed in the silicon semiconductor substrate 11. An element isolation region 14 is formed on the P-well layer 12 and the N-well layer 13 to define first and second element forming areas on the P-well layer 12 and the N-well layer 13, respectively. The first element forming area is for an N-channel metal oxide semiconductor field effect transistor (NMOSFET) region while the second element forming area is for a P-channel metal oxide semiconductor field effect transistor (PMOSFET) region.

First and second gate insulating layers 15-1 and 15-2 are formed on the first and the second element forming areas by thermal oxidation process. By a chemical vapor deposition (CVD) process, first and second polysilicon layers are deposited on the first and the second gate insulating layers 15-1 and 15-2, respectively. Phosphorus (P) is diffused in the first and the second polysilicon layers to form first and second phosphorus-doped polysilicon layers 72-1 and 82-1, respectively. By a sputtering process, first and second tungsten silicide films 72-2 and 82-2 are deposited on the first and the second phosphorus-doped polysilicon layers 72-1 and 82-1, respectively. By anisotropic etching of the first and the second phosphorus-doped polysilicon layers 72-1 and 82-1 and of the first and the second tungsten silicide films 72-2 and 82-2, first and second gate electrodes 72 and 82 are formed on the first and the second gate insulating layers 15-1 and 15-2, respectively. A silicon oxide film is deposited on an entire surface of the silicon semiconductor substrate 11 by a chemical vapor deposition (CVD) process. By anisotropic etching of the silicon oxide film, first and second oxide film spacers 16-1 and 16-2 are formed on side surfaces of the first and the second gate electrodes 72 and 82, respectively.

Subsequently, ion implantation of arsenic (As) serving as an N-type impurity is made in the P-well layer 12 to form source and drain regions 17 of the NMOSFET region on the P-well layer 12. Ion implantation of boron difluoride (BF$_2$) serving as a P-type impurity is made in the N-well layer 13 to form source and drain regions 18 of the PMOSFET region on the N-well layer 13.

Figure 7B:
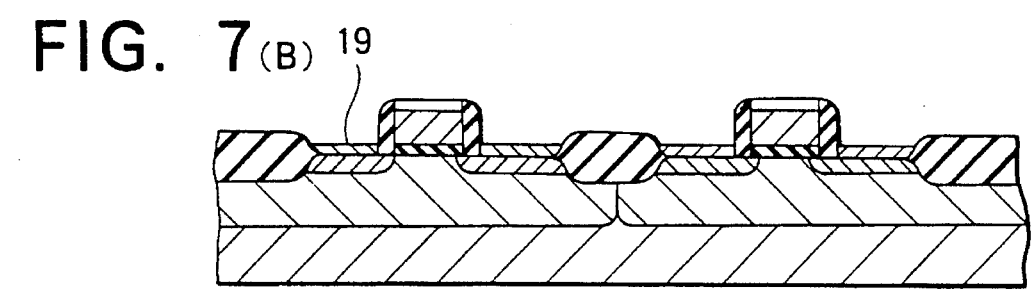

Turning to FIG. 7(B), by a CVD process using disilane gas at about 600° C., on the source and drain regions 17 and 18 alone are selectively deposited silicon films 19 having impurities of about $10^{18}$ cm$^{-3}$ or below and a thickness of 50 nm or below.

Subsequently, ion implantation of arsenic (As) is made in the selectively grown silicon films 19, the source and drain regions 17 and 18, and the first and the second gate electrodes 72 and 82 under the condition of acceleration voltage of 30 keV and of dose amount of $3\times10^{14}$ cm$^{-2}$ to amorphize.

Figure 7C:
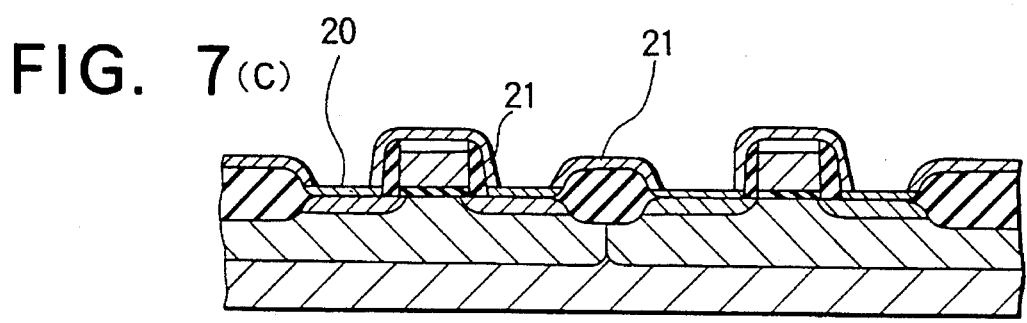

Turning to FIG. 7(C), by sputtering process, a titanium film of a thickness of 50 nm is deposited on the entire surface of the silicon semiconductor substrate 11. By lamp annealing process at 650° C. for 10 seconds, titanium disilicide films 20 are formed on the source and drain regions 17 and 18 in a self-alignment fashion.

Figure 7D:
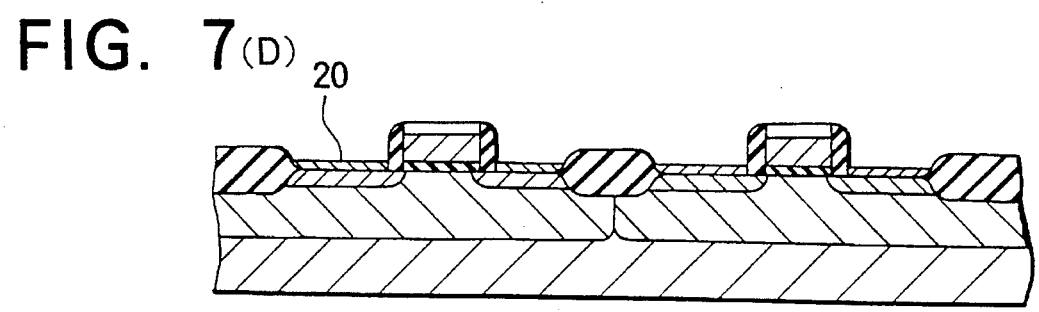

Turning to FIG. 7(D), unreacted metal films 21 on the insulating films 16-1 and 16-2 and on the gate electrodes 17 and 18 are selectively removed by wet etching process using an aqueous solution of hydrogen peroxide system. Subsequently, by lamp annealing process at 850° C. for 10 seconds, the titanium disilicide films 20 on the source and drain regions 17 and 18 are made low resistance. As a result, the CMOS device is formed as shown in FIG. 7(D).

EXAMPLE 3

Referring to FIGS. 8(A) through 8(D), description will be made as regards a method of manufacturing a semiconductor device according to a third embodiment of the present invention. The illustrated semiconductor device is a complementary metal oxide semiconductor (CMOS) device of polycide structure.

Figure 8A:
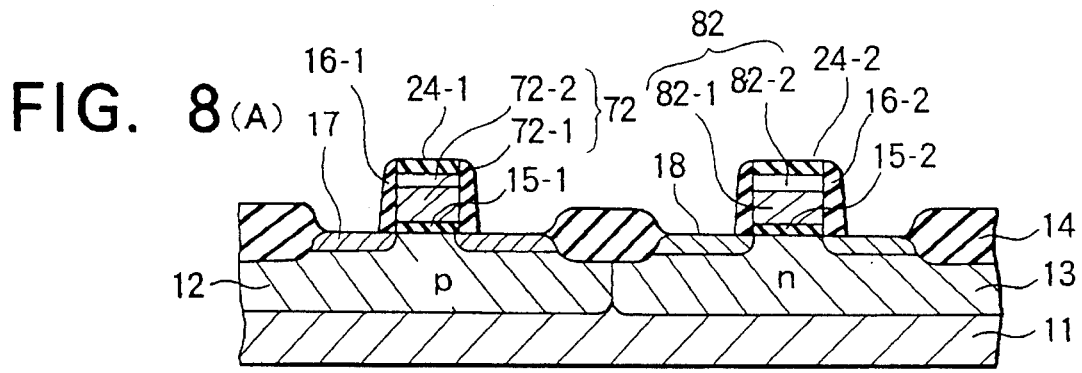
FIGS. 8(A)–8(D) illustrate the manufacturing process sequence of the semiconductor device according to a second embodiment of the present invention.

As shown in FIG. 8(A), a silicon semiconductor substrate 11 is prepared in a known manner. A P-well layer 12 and an N-well layer 13 are formed in the silicon semiconductor substrate 11. An element isolation region 14 is formed on the P-well layer 12 and the N-well layer 13 to define first and second element forming areas on the P-well layer 12 and the N-well layer 13, respectively. The first element forming area is for an N-channel metal oxide semiconductor field effect transistor (NMOSFET) region while the second element forming area is for a P-channel metal oxide semiconductor field effect transistor (PMOSFET) region.

By thermal oxidation process, first and second gate insulating layers 15-1 and 15-2 are formed on the first and the second element forming areas, respectively. By a chemical vapor deposition (CVD) process, first and second polysilicon layers are deposited on the first and the second gate insulating layers 15-1 and 15-2, respectively. Phosphorus (P) is diffused in the first and second polysilicon layers to form first and second phosphorus-doped polysilicon layers 72-1 and 82-1, respectively. By a sputtering process, first and second tungsten silicide films 72-2 and 82-2 are deposited on the first and the second phosphorus-doped polysilicon layers 72-1 and 82-1, respectively. By the CVD process, first and second silicon oxide films 24-1 and 24-2 are deposited on the first and the second tungsten silicide films 72-2 and 82-2, respectively.

By anisotropic etching of the first and the second phosphorus-doped polysilicon layers 72-1 and 82-1, of the first and the second tungsten silicide films 72-2 and 82-2, and of the first and the second silicon oxide films 24-1 and 24-2, first and second gate electrodes 72 and 82 and the first and the second silicon oxide films 24-1 and 24-2 are formed on the first and the second gate insulating layers 15-1 and 15-2, respectively. A silicon oxide film is deposited on an entire surface of the silicon semiconductor substrate 11 by the CVD process. By anisotropic etching of the silicon oxide film, first and second oxide film spacers 16-1 and 16-2 are formed on side surfaces of the first and the second gate electrodes 72 and 82, respectively.

Subsequently, ion implantation of arsenic (As) serving as an N-type impurity is made in the P-well layer 12 to form source and drain regions 17 of the NMOSFET region on the P-well layer 12. Ion implantation of boron difluoride (BF$_2$) serving as a P-type impurity is made in the N-well layer 13 to form source and drain regions 18 of the PMOSFET region on the N-well layer 13.

Figure 8B:
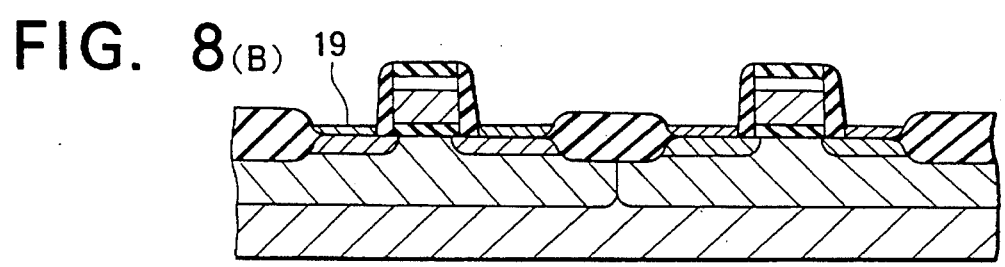

Turning to FIG. 8(B), by the CVD process using disilane gas at about 600° C., on the source and drain regions 17 and 18 alone are selectively deposited silicon films 19 having impurities of about $10^{18}$ cm$^{-3}$ and having a thickness of 50 nm.

Subsequently, ion implantation of boron difluoride (BF$_2$) is made in the selectively grown silicon films 19, the source and drain regions 17 and 18, and the first and the second gate electrodes 72 and 82 under the condition of acceleration voltage of 50 keV and of dose amount of $5\times10^{14}$ cm$^{-2}$ to amorphize.

Figure 8C:
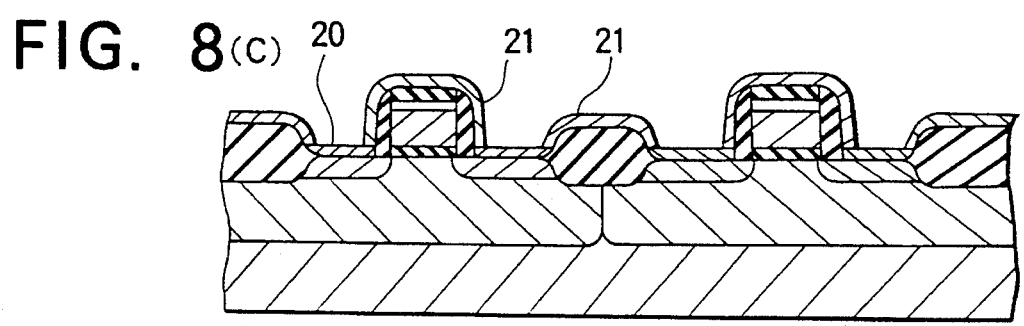

Turning to FIG. 8(C), by sputtering process, a titanium film of a thickness of 60 nm is deposited on the entire surface of the silicon semiconductor substrate 11. By lamp annealing process at 690° C. for 15 seconds, titanium disilicide films 20 are formed on the source and drain regions 17 and 18 in a self-alignment fashion.

Figure 8D:
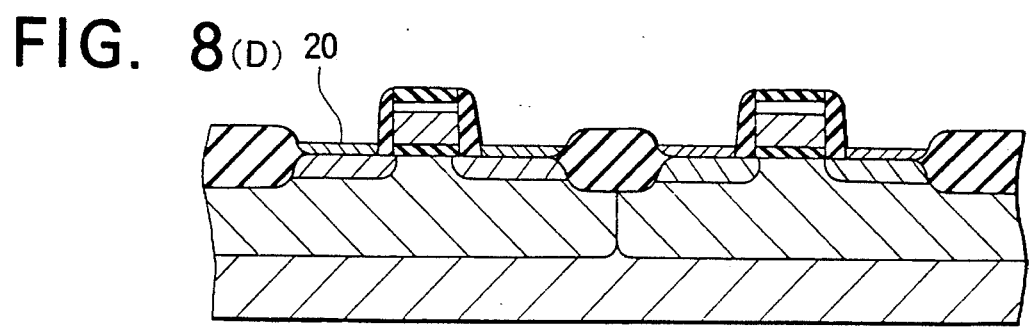

Turning to FIG. 8(D), unreacted metal films 21 on the insulating films 16-1, 16-2, 24-1, and 24-2 are selectively removed by wet etching process using an aqueous solution of hydrogen peroxide system. Subsequently, by lamp annealing process at 890° C. for 15 seconds, the titanium disilicide films 20 on the source and drain regions 17 and 18 are made low resistance. As a result, the CMOS device is formed as shown in FIG. 8(D).

While this invention has thus far been described in conjunction with a few embodiments thereof, it will now be readily possible for those skilled in the art to put this invention into practice in various other manners. For example, silane gas may be used for growing the silicon film 19 instead of the disilane gas. Silicon may be used for ion implantation to amorphize in place of arsenic (As) and boron difluoride (BF$_2$). Molybdenum (Mo), tungsten (W), tantalum (Ta), or the like may be used as a metal for forming a silicide instead of titanium (Ti).

What is claimed is:

1. A method of manufacturing a semiconductor device comprising the steps of:

(a) forming silicon gate electrodes on gate insulating films on a silicon semiconductor substrate on which an element separation region is formed, said silicon gate electrodes having an upper surface and a side surface;

(b) forming insulating films on the side surface of said silicon gate electrodes;

(c) performing ion implantation of impurities in the element separation region to form source and drain regions of N-channel type and P-channel type field effect transistors on said silicon semiconductor substrate;

(d) selectively depositing silicon films on said source and drain regions and on the upper surface of said silicon gate electrodes, said silicon films having impurity concentration less than $10^{19}$ cm$^{-3}$;

(e) amorphizing said silicon films, said silicon gate electrodes, and said silicon semiconductor substrate by ion implantation;

(f) depositing a metal film on said silicon films and on said silicon gate electrodes;

(g) performing heat treatment of said metal film to form metal silicide films on said source and drain regions and on the upper surface of said silicon gate electrodes; and (h) removing unreacted metal films remaining on said insulating films.

2. A method as claimed in claim 1, wherein said step (d) is performed by a chemical vapor deposition process of a reaction rate-determining mode by using disilane gas.

3. A method as claimed in claim 1, wherein said step (d) is performed by a chemical vapor deposition process of a reaction rate-determining mode by using silane gas.

4. A method of manufacturing a semiconductor device comprising the steps of:

(a) forming gate electrodes on gate insulating films on a silicon semiconductor substrate on which an element separation region is formed, each of said gate electrodes consisting of a polysilicon film and a first metal silicide film, each of said gate electrodes having a side surface;

(b) forming insulating films on the side surface of said gate electrodes;

(c) performing ion implantation of impurities in the element separation region to form source and drain regions of N-channel type and P-channel type field effect transistors on said silicon semiconductor substrate;

(d) selectively depositing silicon films on said source and drain regions, said silicon films having impurity concentration less than $10^{19}$ cm$^{-3}$;

(e) amorphizing said silicon films, said gate electrodes, and said silicon semiconductor substrate by ion implantation;

(f) depositing a metal film on said silicon films and on said gate electrodes;

(g) performing heat treatment of said metal film to form second metal silicide films on said source and drain regions; and (h) removing unreacted metal films remaining on said insulating films and on said gate electrodes.

5. A method as claimed in claim 4, wherein said step (d) is performed by a chemical vapor deposition process of a reaction rate-determining mode by using disilane gas.

6. A method as claimed in claim 4, wherein said step (d) is performed by a chemical vapor deposition process of a reaction rate-determining mode by using silane gas.

7. A method of manufacturing a semiconductor device comprising the steps of:

(a) forming gate electrodes on gate insulating films on a silicon semiconductor substrate on which an element separation region is formed, each of said gate electrodes consisting of a polysilicon film and a first metal silicide film, each of said silicon gates having an upper surface and a side surface;

(b) forming insulating films on both of the upper surface and the side surface of said gate electrodes;

(c) performing ion implantation of impurities in the element separation region to form source and drain regions of N-channel type and P-channel type field effect transistors on said silicon semiconductor substrate;

(d) selectively depositing silicon films on said source and drain regions, said silicon films having impurity concentration less than $10^{19}$ cm$^{-3}$;

(e) amorphizing said silicon films, said gate electrodes, and said silicon semiconductor substrate by ion implantation;

(f) depositing a metal film on said silicon films and on said gate electrodes;

(g) performing heat treatment of said metal film to form second metal silicide films on said source and drain regions; and (h) removing unreacted metal films remaining on said insulating films.

8. A method as claimed in claim 7, wherein said step (d) is performed by a chemical vapor deposition process of a reaction rate-determining mode by using disilane gas.

9. A method as claimed in claim 7, wherein said step (d) is performed by a chemical vapor deposition process of a reaction rate-determining mode by using silane gas.

* * * * *